(12) United States Patent
Bhakta et al.

(10) Patent No.: US 6,930,900 B2
(45) Date of Patent: Aug. 16, 2005

(54) ARRANGEMENT OF INTEGRATED CIRCUITS IN A MEMORY MODULE

(75) Inventors: Jayesh R. Bhakta, Cerritos, CA (US); Robert S. Pauley, Jr., San Juan Capistrano, CA (US)

(73) Assignee: Netlist, Inc., Irvine, CA (US)

( * ) Notice: Subject to any disclaimer, the term of this patent is extended or adjusted under 35 U.S.C. 154(b) by 18 days.

(21) Appl. No.: 10/765,420

(22) Filed: Jan. 27, 2004

(65) Prior Publication Data

US 2004/0184299 A1 Sep. 23, 2004

Related U.S. Application Data

(62) Division of application No. 10/094,512, filed on Mar. 7, 2002, now Pat. No. 6,751,113.

(51) Int. Cl.[7] .............................. G11C 5/06; G11C 5/02; G11C 19/00; G06F 12/00; G06F 13/00
(52) U.S. Cl. ............................. 365/51; 365/63; 365/78; 711/2; 711/5; 711/104; 711/111; 711/115
(58) Field of Search ............................. 365/63, 51, 78; 711/2, 5, 104, 111, 115

(56) References Cited

U.S. PATENT DOCUMENTS

| | | |
|---|---|---|
| 4,280,176 A | 7/1981 | Tan |
| 4,679,167 A | 7/1987 | Finnell |
| 5,012,389 A | 4/1991 | Perry |
| 5,164,916 A | 11/1992 | Wu et al. |
| 5,191,404 A | 3/1993 | Wu et al. |
| 5,226,136 A | 7/1993 | Nakagawa |
| 5,303,123 A | 4/1994 | Chandler et al. |
| 5,383,148 A | 1/1995 | Testa et al. |
| 5,412,538 A | 5/1995 | Kikinis et al. |
| 5,428,762 A | 6/1995 | Curran et al. |
| 5,465,229 A | 11/1995 | Bechtolsheim et al. |

(Continued)

FOREIGN PATENT DOCUMENTS

| | | |
|---|---|---|
| JP | 60034054 A | 2/1985 |

OTHER PUBLICATIONS

PCT International Search Report dated Aug. 29, 2003 for counterpart PCT application No. PCT US/03/06978 filed Mar. 6, 2003, in 5 pages.
JEDEC Standard No. 21–C, 4.20.2—168 Pin, PC133 SDRAM Registered DIMM Design Specification, Revision 1.4, Release 11a, Feb. 2002.

(Continued)

Primary Examiner—Hoai Ho
Assistant Examiner—Ly Duy Pham
(74) Attorney, Agent, or Firm—Knobbe, Martens, Olson & Bear, LLP

(57) ABSTRACT

Integrated circuits utilizing standard commercial packaging are arranged on a printed circuit board to allow the production of 1-Gigabyte and 2-Gigabyte capacity memory modules. A first row of integrated circuits is oriented in an opposite orientation to a second row of integrated circuits. The integrated circuits in a first half of the first row and in the corresponding half of the second row are connected via a signal trace to a first register. The integrated circuits in a second half of the first row and in the corresponding half of the second row are connected to a second register. Each register processes a non-contiguous subset of the bits in each data word.

15 Claims, 9 Drawing Sheets

U.S. PATENT DOCUMENTS

| | | | |
|---|---|---|---|
| 5,495,435 A | 2/1996 | Sugahara | |
| 5,513,135 A | 4/1996 | Dell et al. | |
| 5,532,954 A | 7/1996 | Bechtolsheim et al. | |
| 5,541,448 A | 7/1996 | Carpenter | |
| 5,572,691 A | 11/1996 | Koudmani | |
| 5,606,717 A | 2/1997 | Farmwald et al. | |
| 5,631,807 A | 5/1997 | Griffin | |
| 5,642,323 A | 6/1997 | Kotani et al. | |
| 5,652,462 A | 7/1997 | Matsunaga et al. | |
| 5,652,861 A | 7/1997 | Mayo et al. | |
| 5,661,339 A | 8/1997 | Clayton | |
| 5,691,946 A | 11/1997 | DeBrosse et al. | |
| 5,712,811 A | 1/1998 | Kim | |
| 5,737,192 A | 4/1998 | Linderman | |
| 5,754,408 A | 5/1998 | Derouiche | |
| 5,835,932 A | 11/1998 | Rao | |
| 5,847,985 A | 12/1998 | Mitani et al. | |
| 5,867,448 A | 2/1999 | Mann | |
| 5,953,738 A | 9/1999 | Rao | |
| 5,973,951 A | 10/1999 | Bechtolsheim et al. | |
| 6,002,861 A * | 12/1999 | Butts et al. | 703/16 |
| 6,021,048 A | 2/2000 | Smith | |
| 6,072,744 A | 6/2000 | Kwean | |
| 6,097,619 A | 8/2000 | Nguyen et al. | |
| 6,151,235 A | 11/2000 | Kitagawa et al. | |
| 6,157,538 A | 12/2000 | Ali et al. | |
| 6,169,325 B1 * | 1/2001 | Azuma et al. | 257/685 |
| 6,181,004 B1 | 1/2001 | Koontz et al. | |
| 6,185,644 B1 * | 2/2001 | Farmwald et al. | 710/301 |
| 6,185,654 B1 * | 2/2001 | Van Doren | 711/5 |
| 6,215,718 B1 | 4/2001 | Koelling | |
| 6,222,737 B1 | 4/2001 | Ross | |
| 6,222,739 B1 | 4/2001 | Bhakta et al. | |
| 6,353,539 B1 | 3/2002 | Horine et al. | |
| 6,353,867 B1 * | 3/2002 | Qureshi et al. | 710/305 |
| 6,480,946 B1 * | 11/2002 | Tomishima et al. | 711/167 |
| 6,502,161 B1 | 12/2002 | Perego et al. | |
| 6,532,158 B1 | 3/2003 | Buttet | |
| 6,545,895 B1 | 4/2003 | Li et al. | |
| 6,594,167 B1 * | 7/2003 | Yamasaki et al. | 365/51 |
| 6,594,712 B1 | 7/2003 | Pettey et al. | |
| 6,617,695 B1 * | 9/2003 | Kasatani | 357/778 |
| 6,625,685 B1 * | 9/2003 | Cho et al. | 711/5 |
| 6,705,877 B1 | 3/2004 | Li et al. | |
| 6,757,751 B1 | 6/2004 | Gene | |
| 6,766,433 B2 * | 7/2004 | Circello et al. | 711/202 |
| 2001/0050856 A1 * | 12/2001 | Matsuzaki | 365/1 |
| 2002/0088633 A1 | 7/2002 | Kong et al. | |
| 2003/0014578 A1 | 1/2003 | Pax | |
| 2003/0048616 A1 | 3/2003 | Ko et al. | |
| 2003/0051091 A1 | 3/2003 | Leung et al. | |
| 2003/0057564 A1 | 3/2003 | Leedy | |
| 2003/0061447 A1 | 3/2003 | Perego et al. | |
| 2003/0075789 A1 * | 4/2003 | Kawamura et al. | 257/678 |
| 2003/0090879 A1 | 5/2003 | Doblar et al. | |

OTHER PUBLICATIONS

JEDEC Standard No. 21–C, 4.20.3—144 Pin, PC133 SDRAM Unbuffered SO–DIMM, Reference Design Specification, Revision 1.02, Release 11.

JEDEC Standard No. 21–C, DDR SDRAM PC2100 and PC1600 DDR SDRAM Registered DIMM Design Specification, Revision 1.3, Release 11b, Jan. 2002.

JEDEC Standard No. 21–C, 4.20.5—184 Pin PC1600/2100 SDRAM Unbuffered DIMM Design Specification, Revision 1.1, Release 11b.

JEDEC Standard No. 21–C, 4.20.6—200 Pin, PC2700/ PC2100/PC1600 DDR SDRAM Unbuffered SO–DIMM Reference Design Specification, Revision 1.1, Release 11b, Apr. 26, 2002.

Intel, PC SDRAM Registered DIMM Design Support Document, Revision 1.2, Oct. 1998.

Intel Corporation, 66/100 MHz PC SDRAM 64–Bit Non– ECC/Parity 144 Pin Unbuffered SO–DIMM Specification, Revision 1.0, Feb. 1999.

* cited by examiner

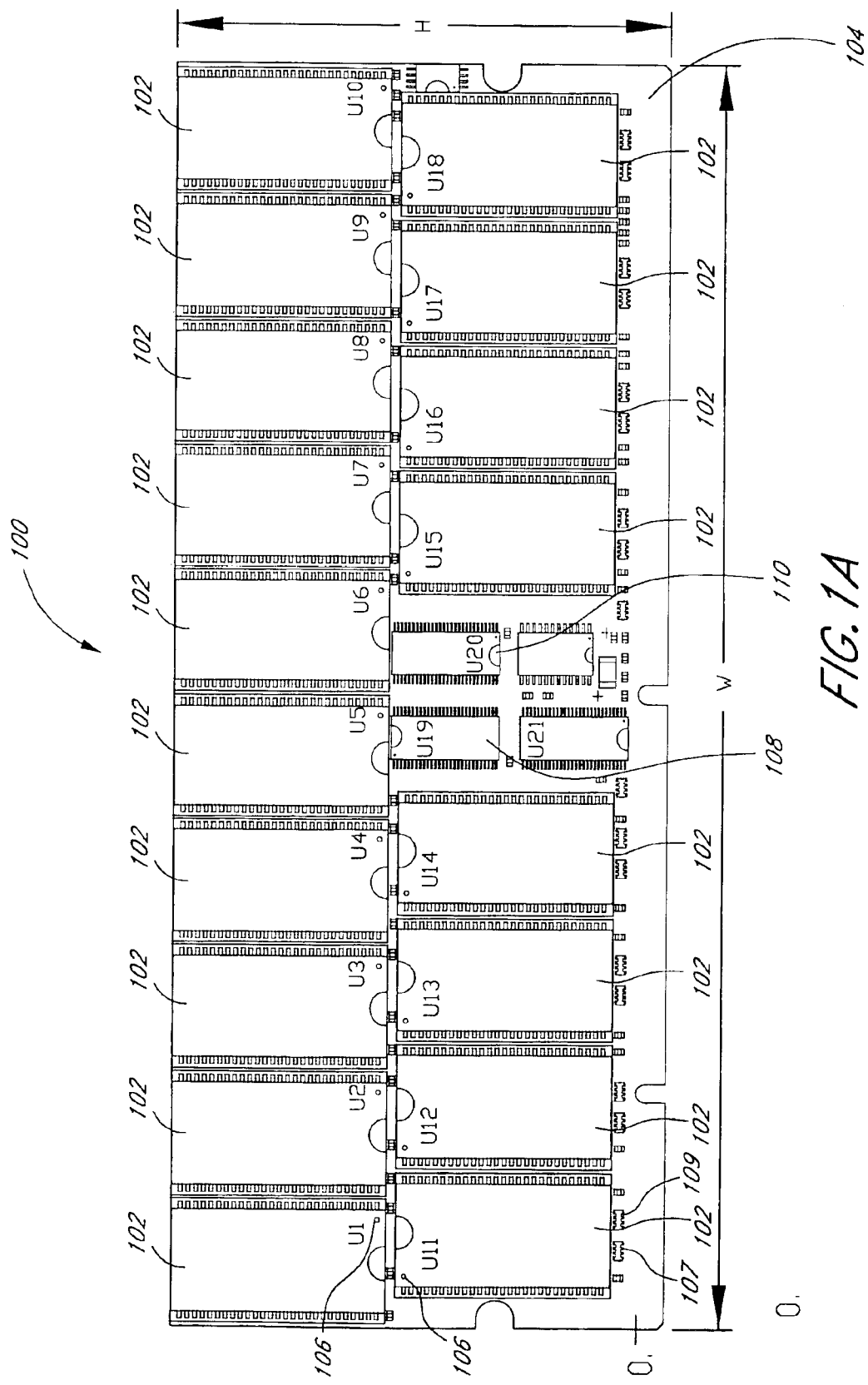

ARRANGEMENT OF INTEGRATED CIRCUITS IN A MEMORY MODULE

CLAIM OF PRIORITY

This application is a divisional of U.S. patent application Ser. No. 10/094,512, filed Mar. 7, 2002, the disclosure of which is hereby incorporated in its entirety by reference herein.

CROSS-REFERENCE TO CO-PENDING APPLICATIONS

This application is related to U.S. patent application Ser. No. 10/674,240, filed Sep. 29, 2003, U.S. patent application Ser. No. 10/674,082, filed Sep. 29, 2003, and U.S. patent application Ser. No. 10/765,488, filed on Jan. 27, 2004, each of which is a divisional application of U.S. patent application Ser. No. 10/094,512, filed Mar. 7, 2002 now U.S. Pat. No. 6,751,113. This application is also related to U.S. patent application Ser. No. 10/769,469, filed on Jan. 29, 2004, which is a continuation-in-part of U.S. patent application Ser. No. 10/094,512, filed on Mar. 7, 2002, and to U.S. patent application Ser. No. 10/768,534, filed on Jan. 30, 2004, which is a continuation of U.S. patent application Ser. No. 10/094,512, filed on Mar. 7, 2002.

BACKGROUND OF THE INVENTION

1. Field of the Invention

The present invention relates to memory modules for use in computers. More specifically, the invention relates to the layout and organization of SDRAM memory modules to achieve 1-Gigabyte (i.e., 1,073,741,824 bytes) or more capacity using standard TSOP integrated circuits.

2. Description of the Related Art

The demand for high speed, high capacity memory modules for use in the computer industry has grown rapidly. The average base memory capacity of servers recently increased from 512 Megabytes to 1.2 Gigabytes. The cost of dynamic random access memory (DRAM) modules declined by more than 75%.

To successfully operate in a computer, a memory module must meet standard timing and interface requirements for the type of memory module intended for use in the particular computer. These requirements are defined in design specification documents that are published by either the original initiator of the standard (e.g., Intel or IBM) or a standards issuing body such as JEDEC (formerly, the Joint Electron Device Engineering Council). Among the most important design guidelines for memory module manufactures are those for PC SDRAM, PC133 SDRAM, and DDR SDRAM. The requirements documents also provide design guidelines which, if followed, will result in a memory module that meets the necessary timing requirements.

To meet the requirements defined in the SDRAM design guidelines and respond to consumer demand for higher capacity memory modules, manufacturers of memory modules have attempted to place a higher density of memory integrated circuits on boards that meet the 1.75" board height guideline found in the design specifications. Achieving the effective memory density on the printed circuit board has presented a substantial challenge to memory module manufacturers. High memory density on the memory module board has been achieved via the use of stacked integrated circuits and the use of more compact integrated circuit connector designs, such as micro-BGA (Ball Grid Array).

Use of non-standard integrated circuits, such as micro-BGA integrated circuits increases costs. Micro-BGA integrated circuits use a connection technique that places the connections for the integrated circuit between the body of the integrated circuit and the printed circuit board. Consequently, micro-BGA integrated circuits can be placed closer to one another on a board than can integrated circuits using the more prevalent TSOP (Thin Small Outline Package) packaging techniques. However, integrated circuits using micro-BGA connectors typically cost twice as much as comparable capacity TSOP integrated circuits.

Stacking a second layer of integrated circuits on top of the integrated circuits directly on the surface of the printed circuit board allows the manufacturer to double the memory density on the circuit board. However, the stacking of integrated circuits results in twice as much heat generation as with single layers of integrated circuits, with no corresponding increase in surface area. Consequently, memory modules using stacked integrated circuits have substantial disadvantages over memory modules using a single layer of integrated circuits. Operating at higher temperatures increases the incidence of bit failure. Greater cooling capacity is needed to avoid the problems of high temperature operation. Thermal fatigue and physical failure of the connections between the circuit board and the integrated circuit can result from ongoing heating and cooling cycles.

SUMMARY OF THE INVENTION

A first aspect of the present invention is a memory module comprising a printed circuit board and a plurality of identical integrated circuits. The integrated circuits are mounted on one or both sides of the printed circuit board in first and second rows. The integrated circuits in the first row on a side are oriented in an opposite orientation from the integrated circuits in the second row on the same side. The orientation of the integrated circuits are indicated by an orientation indicia contained on each integrated circuit.

Another aspect of the present invention is a memory module comprising a printed circuit board. A plurality of identical integrated circuits are mounted in two rows on at least one side of the printed circuit board. The memory module also includes a control logic bus, a first register and a second register. The control logic bus is connected to the integrated circuits. The first register and the second register are connected to the control logic bus. Each row of integrated circuits is divided into a first lateral half and a second lateral half. The first register addresses the integrated circuits in the first lateral half of both rows. The second register addresses the integrated circuits in the second lateral half of both rows.

Another aspect of the present invention is a memory module comprising a printed circuit board. A plurality of identical integrated circuits are mounted in two rows on at least one side of the printed circuit board. The memory module includes a control logic bus, a first register and a second register. The control logic bus is connected to the integrated circuits. The first register and the second register are connected to the control logic bus. The first register accesses a first range of data bits and a second range of data bits. The second register accesses a third range of data bits and a fourth range of data bits. The first range of data bits and the second range of data bits are non-contiguous subsets of a data word. The third range of data bits and the fourth range of data bits are also non-contiguous subsets of a data word.

A further aspect of the present invention is a method for arranging integrated circuit locations on a printed circuit board. The method comprises placing locations for the integrated circuits in a first row and a second row onto at least one surface of a printed circuit board. The integrated circuit locations in the second row are oriented 180 degrees relative to an orientation of the integrated circuit locations in the first row.

Another aspect of the present invention is a method for the manufacture of memory modules. The method comprises placing the locations for the integrated circuits on a printed circuit board in a first row and a second row on at least one side of the printed circuit board, and orienting the integrated circuit locations in the first row 180 degrees relative to the orientation of the integrated circuits in the second row. The method further comprises interconnecting the integrated circuit locations in a first half of the first row of integrated circuits and the first half of the second row of integrated circuits to a first register location, and interconnecting the integrated circuit locations in a second half of the first row of integrated circuit locations and the second half of the second row of integrated circuit locations to a second register location. The method also comprises placing identical integrated circuits at the integrated circuit locations in the printed circuit board.

Another aspect of the present invention is a 1-Gigabyte capacity memory module comprising 36 integrated circuits. The integrated circuits are 256-Megabit (i.e., 268,435,456 bits) SDRAM organized as 64 Meg by 4 bits (i.e., 67,108,864 addressed locations with 4 bits per location). The integrated circuits are in a Thin Small Outline Package (TSOP). The memory module has an approximate width of 5.25 inches (133.350 mm) and an approximate height of 2.05 inches (52.073 mm).

Another aspect of the present invention is a 2-Gigabyte capacity memory module comprises 36 integrated circuits. The integrated circuits are 512-Megabit (i.e., 536,870,912 bits) SDRAM organized as 128 Meg by 4 bits (i.e., 134,217,728 addressed locations with 4 bits per location). The integrated circuits are in a Thin Small Outline Package (TSOP). The memory module has an approximate width of 5.25 inches (133.350 mm) and an approximate height of 2.05 inches (52.073 mm).

BRIEF DESCRIPTION OF THE DRAWINGS

The accompanying drawings are included to provide a further understanding of the present invention and are incorporated in and constitute a part of this specification. The drawings illustrate embodiments of the present invention and, together with the description, serve to explain the principles of the invention.

FIG. 1A illustrates a view of the primary side of a memory module in an embodiment of a PC133 SDRAM memory module

DETAILED DESCRIPTION OF THE PREFERRED EMBODIMENT

In the following description, reference is made to the accompanying drawings, which show, by way of illustration, specific embodiments in which the invention may be practiced. Numerous specific details of these embodiments are set forth in order to provide a thorough understanding of the invention. However, it will be obvious to one skilled in the art that the invention may be practiced without the specific details or with certain alternative components and methods to those described herein.

FIG. 1A illustrates the primary side of an embodiment of a memory module 100. The module 100 comprises two rows of memory integrated circuits 102 mounted onto a printed circuit board 104. The memory module 100 meets the timing standards for and is compatible with JEDEC requirements for a PC133 SDRAM module, but departs from the design guidelines contained in the PC133 design specification. In particular, the memory module 100 meets the timing and interface requirements of the PC133 standard notwithstanding the module 100 having a height (H) of approximately two inches. This height exceeds the 1.75" height guideline recommended in the PC133 Design Specification, but allows a single layer of conventional TSOP integrated circuits 102 to be placed in two rows on each side of the printed circuit board 104, thus avoiding the negative characteristics caused by stacking of integrated circuits and also avoiding the use of more expensive micro-BGA integrated circuits. The printed circuit board maintains a width (W) of 5.25" as defined in the PC133 Design Specification.

Figure 1B:
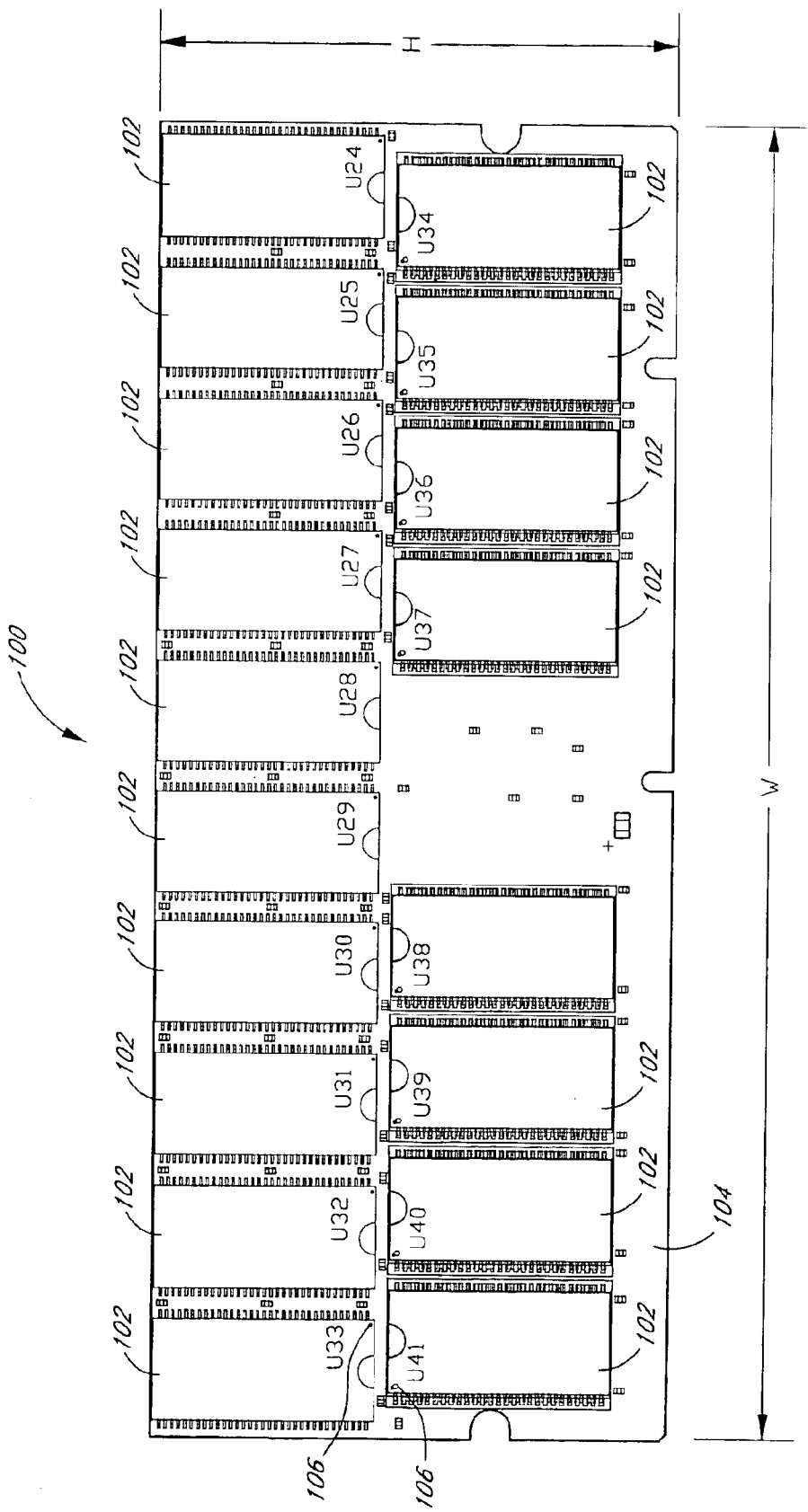
FIG. 1B illustrates a view of the secondary side of the memory module of FIG. 1A.

The memory module 100 is compatible with the timing requirements while using a greater printed circuit board height through the unique layout and arrangement of the integrated circuits 102 on the printed circuit board and the arrangement of integrated circuit interconnections. As illustrated in FIG. 1A, the upper row of integrated circuits 102 (designated U1 through U10) are oriented in the opposite direction from the lower row of integrated circuits 102 (designated U11 through U18). FIG. 1B illustrates the second side of the embodiment of a memory module 100. The upper row of integrated circuits 102 (designated U24 through U33) on the second side of the printed circuit board 104 are placed in an orientation opposite that of the lower row of integrated circuits 102 (designated U34 through U41). The orientation of each integrated circuit 102 can be advantageously determined from an orientation indicia 106. For example in the illustrated embodiment, the orientation indicia is a small circular mark 106 on the surface of the integrated circuit 102.

The different orientations of the upper row of integrated circuits 102 and the lower row of integrated circuits 102 allow the traces on the signal layer of the memory module 100 to be placed such that the trace lengths to the data pins on the integrated circuits 102 in the first (upper) row have substantially the same length as the signal traces to the data pins on the integrated circuits 102 in the second (lower) row.

Figure 4A:
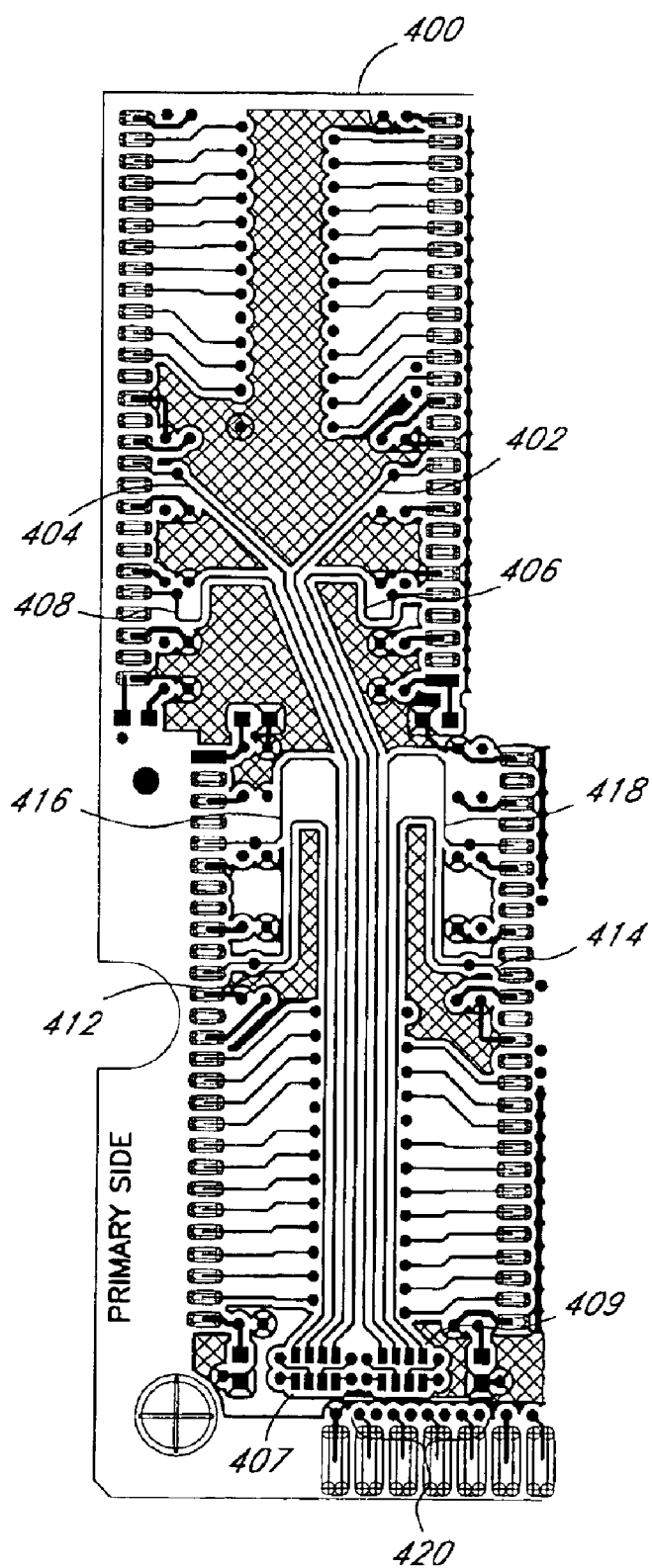
FIG. 4A illustrates a portion of the primary signal layer of a printed circuit board in an embodiment of a memory module.
Figure 4B:
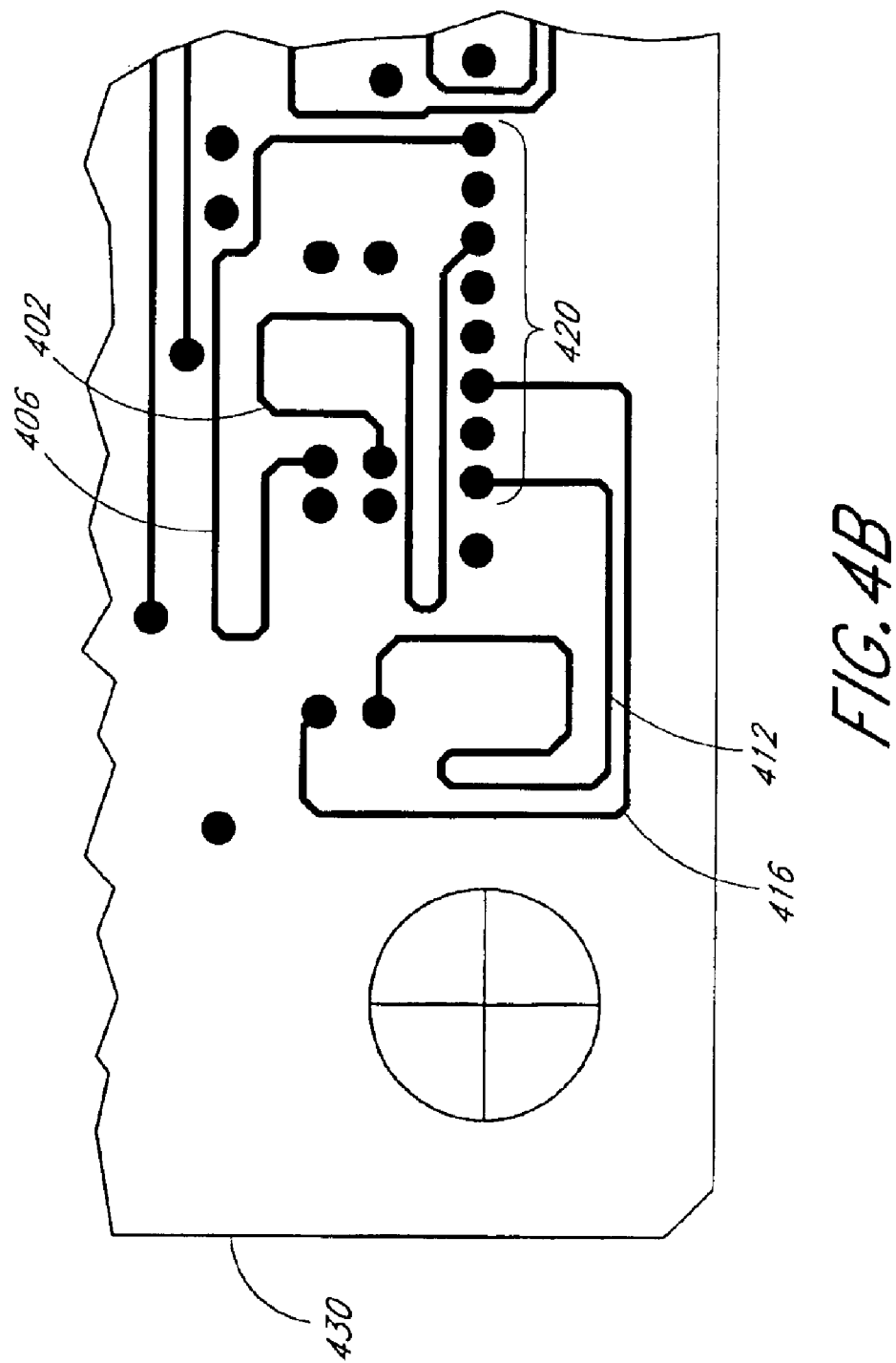
FIG. 4B illustrates a portion of the MID1 layer of a printed circuit board in an embodiment of a memory module.
Figure 4C:
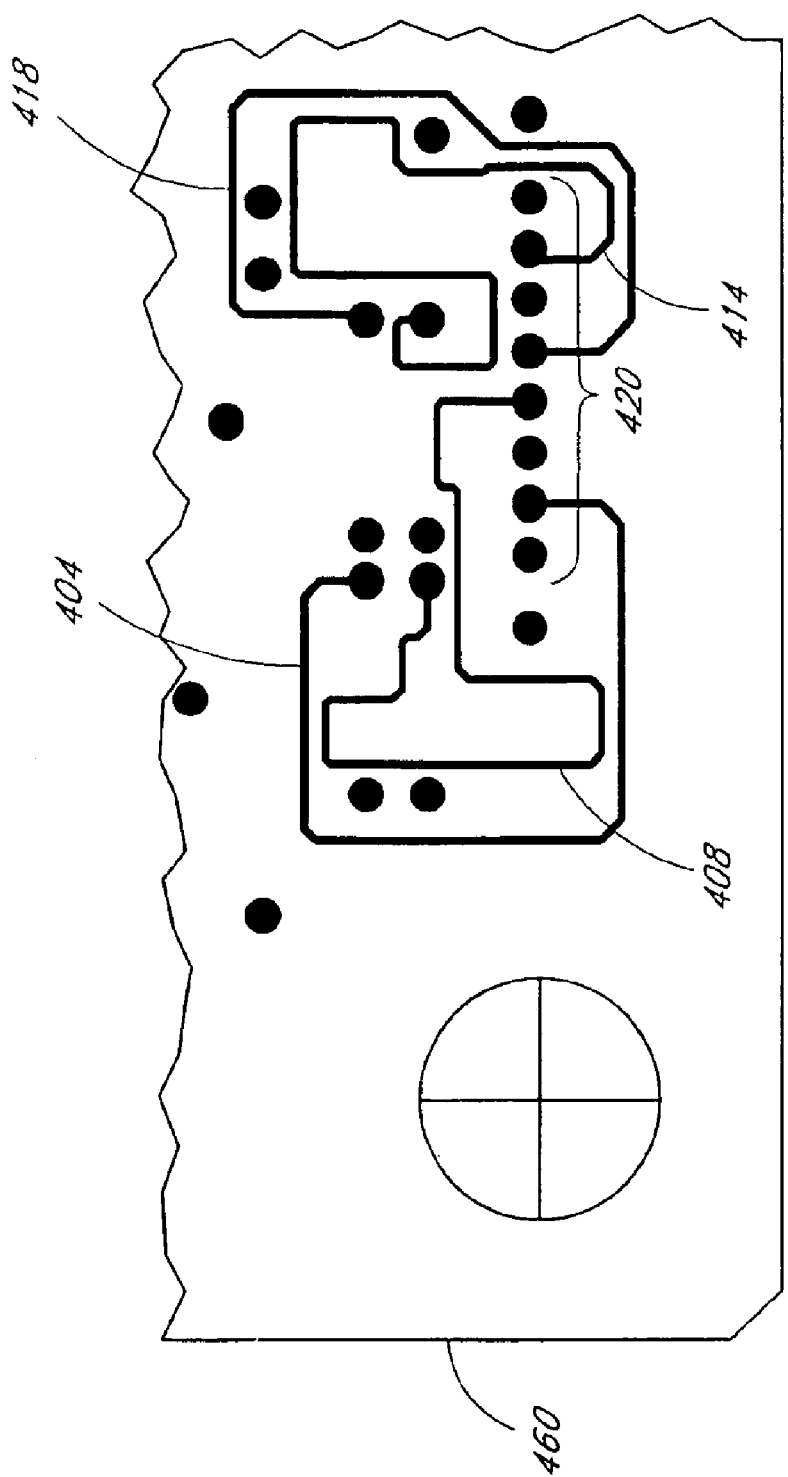
FIG. 4C illustrates a portion of the MID2 layer of a printed circuit board in an embodiment of a memory module.

FIG. 4A illustrates a portion of a primary signal layer 400 of the printed circuit board 104 of the embodiment of a memory module 100 illustrated in FIG. 1A and 1B. FIG. 4B illustrates a portion of a MID1 signal layer 430 of the printed circuit board 104 of the embodiment of a memory module illustrated in FIG. 1A and 1B. FIG. 4C illustrates a portion of a MID2 signal layer 460 of the embodiment of a memory module illustrated in FIG. 1A and 1B.

The illustrated portion of the primary signal layer 400 connects to the integrated circuits 102 designated U1 and U11. A signal trace 404 to one of the data pins of the U1 integrated circuit is designed to have substantially the same length from the data pin of the U1 integrated circuit to the primary memory module connector 420 as the length of a signal trace 414 from the corresponding data pin in the U11 integrated circuit to the primary memory module connector 420. The signal trace 404 from the U1 integrated circuit to the primary memory module connector 420 and the signal trace 414 from the U11 integrated circuit to the primary memory module connector 420 each include a respective portion of signal trace located on the MID2 layer 460 of the printed circuit board 104, as illustrated in FIG. 4C. Similarly, a signal trace 408 from a second data pin on the U1 integrated circuit to the primary memory module connector 420 is designed to be of substantially the same length as the length of a signal trace 418 from the corresponding pin on the U11 integrated circuit to the primary memory module connector 420. As illustrated in FIG. 4C, the signal traces 408, 418 also include respective portions of the traces located on the MID2 layer 460 of the printed circuit board 104.

A signal trace 402 and a signal trace 406 from third and fourth data pins on the U1 integrated circuit to the primary memory module connector 420 are designed to be substantially the same lengths as the lengths of a signal trace 412 and a signal trace 416 from the corresponding data pins on the U11 integrated circuit to the primary memory module connector 420. As illustrated in FIG. 4B, the signal traces 402, 406, 412, 416 include a portion of the signal trace located on the MID1 layer 430 of the printed circuit board 104.

As shown in FIG. 1A, four signal traces 404, 408, 416, 418 include respective resistors 107 affixed to a first set of connection points 407 (FIG. 4A) on the primary signal layer 400 of the printed circuit board 104. As further shown in FIG. 1A, the four signal traces 402, 406, 418, 414 include respective resistors 109 (FIG. 4A) affixed to a second set of connection points 409 on the primary signal layer 400 of the printed circuit board 104. The resistors 107, 109 complete the circuit paths from the integrated circuit pins to the connector 420 and also provide impedance matching required in the JEDEC standards.

The substantially equal signal trace lengths are repeated for each pair of integrated circuit locations in the first and the second row. By reversing the orientation of the integrated circuits 102 from the first row to the second row, the portions of the signal traces on the primary signal layer 400 serving an integrated circuit in the first row have substantially the same lengths as the signal traces serving a corresponding integrated circuit in the second row. The overall lengths of the traces are configured to be substantially equal (to within 10% of the total trace length) by varying the lengths of the portions of the traces located on the MID1 layer 430 and the MID2 layer 460. In addition to the data signal trace lengths, the data mask trace lengths and the clock trace lengths advantageously are maintained to be substantially equal.

Unlike known memory module circuit board designs, the substantial equality of trace lengths is achieved without requiring the addition of repetitious back-and-forth (i.e., serpentine) trace portions to the signal traces of the physically closer integrated circuits 102 to equalize the trace lengths of the signal lines of the closer integrated circuits 102 with the trace lengths of the signal lines of the integrated circuits 102 that are located physically farther from a common signal trace connector area 420. Since printed circuit board 104 space is not consumed with serpentine signal traces, the signal traces are advantageously wider, and the spacing between signal traces is advantageously greater. The greater width and spacing of the signal traces advantageously results in decreased signal noise and interference. The absence of serpentine signal traces advantageously results in a memory module 100 that produces less radio frequency interference and is less susceptible to radio frequency interference.

The timing requirements for the memory module 100 are advantageously met through the use of a second level of symmetry in addition to the use of substantially equal trace lengths. As shown in the block diagram FIG. 3A, the address signals to the integrated circuits 102 in the top and bottom row (integrated circuits designated U1–U5, U24–U28, U11–U14, and U34–U37) on one half of the memory module 100 are routed from a common register 302 via a set 303 of signal paths. The address signals to the integrated circuits 102 on the second half of the memory module 100 (designated U6–U10, U29–U33, U15–U18, and U38–U41) are routed from a common register 304 via a second set 305 of signal paths. The use of the bilateral symmetry allows closer matching of timing performance for the signals from the integrated circuits 102, improves the timing performance, and provides greater performance timing margins than traditional design guidelines in which each integrated circuit in a row of integrated circuits 102 is connected to a single register. The operation of the memory module 100 is synchronized with an external clock signal (not shown) from a computer (not shown) by a clock generator circuit 309, which is discussed in more detail below in connection with FIG. 3B.

Figure 3A:
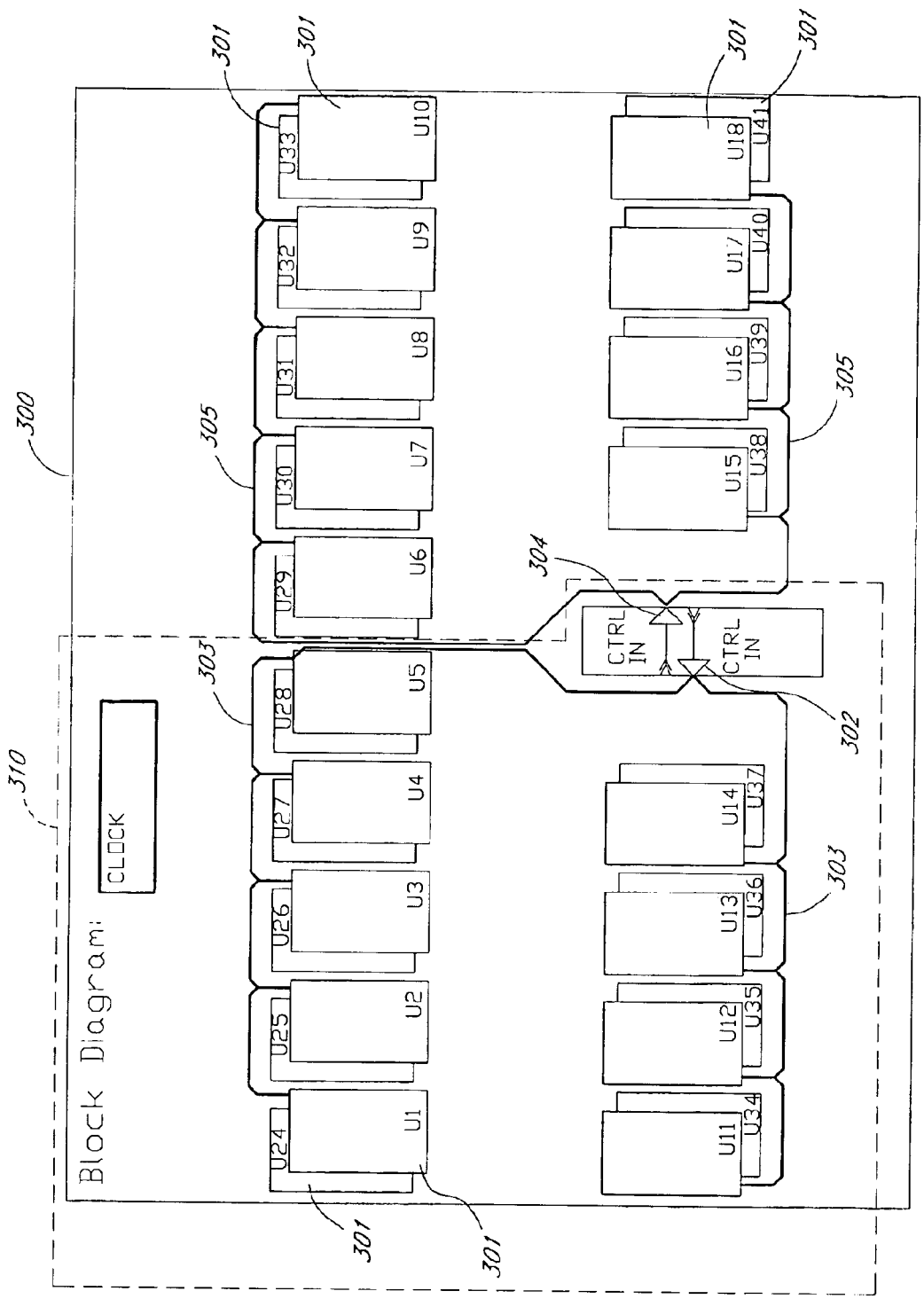
FIG. 3A is a block diagram of an embodiment of a PC 133 SDRAM memory module.
Figure 3B:
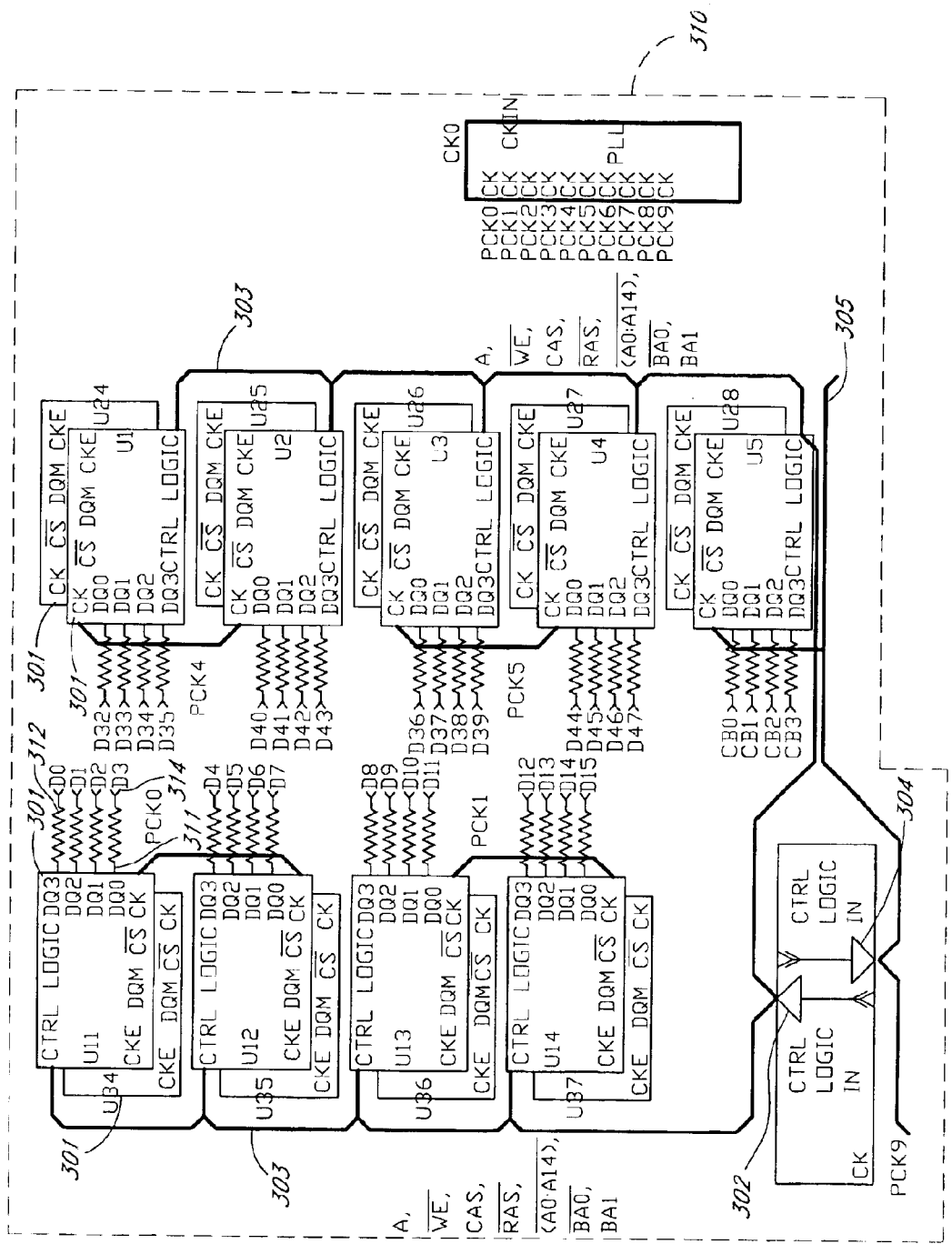
FIG. 3B is an enlargement of one half of the block diagram of FIG. 3A

FIG. 3B illustrates a half 310 of the block diagram shown in FIG. 3A. As shown in FIG. 3B, the bilateral symmetry utilizes non-contiguous ranges of data bits for each addressing register. Rather than handling the bits in contiguous ranges such as bits 0–31 addressed in a first register and bits 32–63 addressed in a second register, as described in the JEDEC design guidelines, the first register 302 addresses data bits 0–15 (designated D0 through D15) and data bits 32–47 (designated D32 through D47). The second register 304 addresses the integrated circuits, 102 on the second half of the board (not shown in FIG. 3B), which store data bits 16–31 and bits 48–63. Each data bit (designated D0 through D63) and each check bit (designated CB0 through CB7) connects to the memory module connection interface 314 via a respective signal trace 311 which contains a respective resistive element 312. The resistive elements 312 in FIG. 3B correspond to the resistors 107, 109 in FIG. 1A. The physical layout of the signal traces 311 is illustrated in FIGS. 4A through 4C. Although the data word must be assembled from the bits addressed by both registers, the use of non-contiguous portions of the data word advantageously allows the use of a symmetric layout of the memory module 100 that complies with memory module timing requirements on a physically larger board than envisioned in the design guidelines. The use of bilateral symmetry in the board layout and the use of non-contiguous bit ranges is advantageously usable for larger data word lengths than the 64-bit word length given in this embodiment.

The operation of the memory integrated circuits U1–U18, U24–U41 and the operation of the common registers 302, 304 are controlled by a plurality of clock signals PCK0–PCK9 from the clock generator circuit 309. The clock generator circuit 309 includes a phase locked loop (PLL) (not shown) that operates in a conventional manner to synchronize the clock signals with an input clock signal (CKIN) from the computer (not shown) or other system into which the memory module is inserted. Each of the clock signals PCK0–PCK8 is connected to four memory integrated circuits, and the clock signal PCK9 is connected to the common registers 302, 304. In the illustrated embodiment, the clock signals are connected to the memory integrated circuits and the common registers as follows (only the connections to the circuits shown in FIG. 3B are illustrated):

| PCK0 | U11, U12, U34, U35 | (D0–D3, D4–D7) |
|------|--------------------|----------------|
| PCK1 | U13, U14, U36, U37 | (D8–D11, D12–D15) |
| PCK2 | U15, U16, U38, U39 | (D16–D19, D20–D23) |

-continued

| PCK3 | U17, U18, U40, U41 | (D24–D27, D28–D31) |
| PCK4 | U1, U2, U24, U25 | (D32–D35, D40–D43) |
| PCK5 | U3, U4, U26, U27 | (D36–D39, D44–D47) |
| PCK6 | U1, U2, U24, U25 | (D48–D51, D52–D55) |
| PCK7 | U9, U10, U32, U33 | (D56–D59, D60–D63) |
| PCK8 | U5, U6, U28, U29 | (CB0–CB3, CB4–CB7) |
| PCK9 | control registers 302, 304 | |

As shown in FIG. 1B, the integrated circuits 102 are advantageously mounted on both sides of the printed circuit board 104. The mounting of integrated circuits 102 on both sides of the printed circuit board, and the use of bilateral symmetry of the signal traces on the printed circuit board advantageously permits the use of a larger printed circuit board and standard memory integrated circuits 102. The integrated circuits 102 used are advantageously commercially available 64 Meg by 4-bit (67,108,864 address locations with 4 bits per location) memory integrated circuits for a 1-Gigabyte capacity memory module 100 and are advantageously commercially available 128 Meg by 4-bit (134,217,728 addressed locations with 4 bits per location) memory integrated circuits for a 2-Gigabyte capacity memory module 100. Because of the location of the data pins of the integrated circuits 102, the four data pins of the integrated circuits 102 on the second side of the printed circuit board 104 are directly opposite the four data pins of the integrated circuits 102 on the first side of the printed circuit board. Thus, the data pins of the integrated circuit on the opposite side are serviced by the signal traces shown in FIG. 4A using a via between the two sides for each signal trace.

Figure 2A:
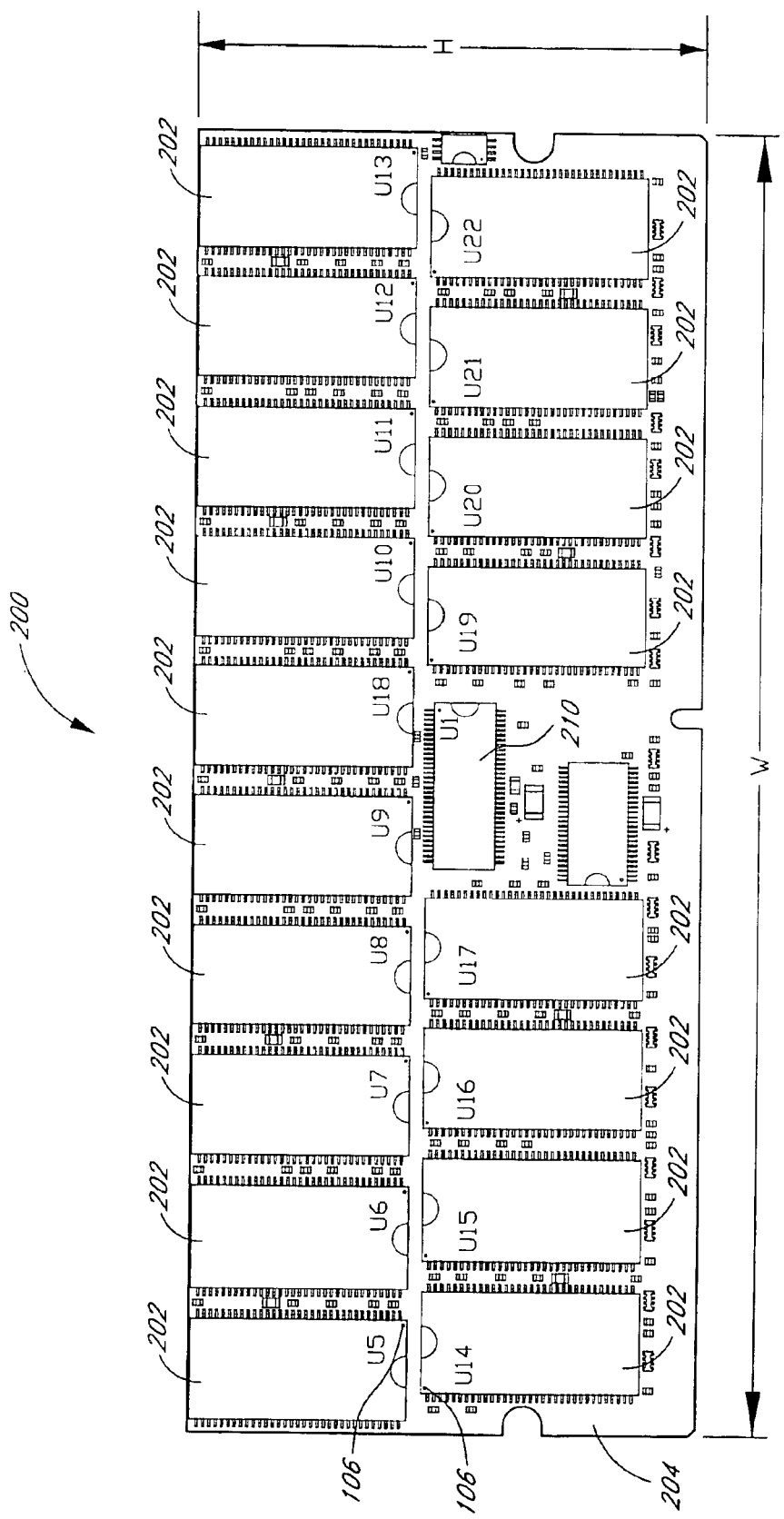
FIG. 2A illustrates a view of the primary side of a memory module in an embodiment of a DDR SDRAM memory module.
Figure 2B:
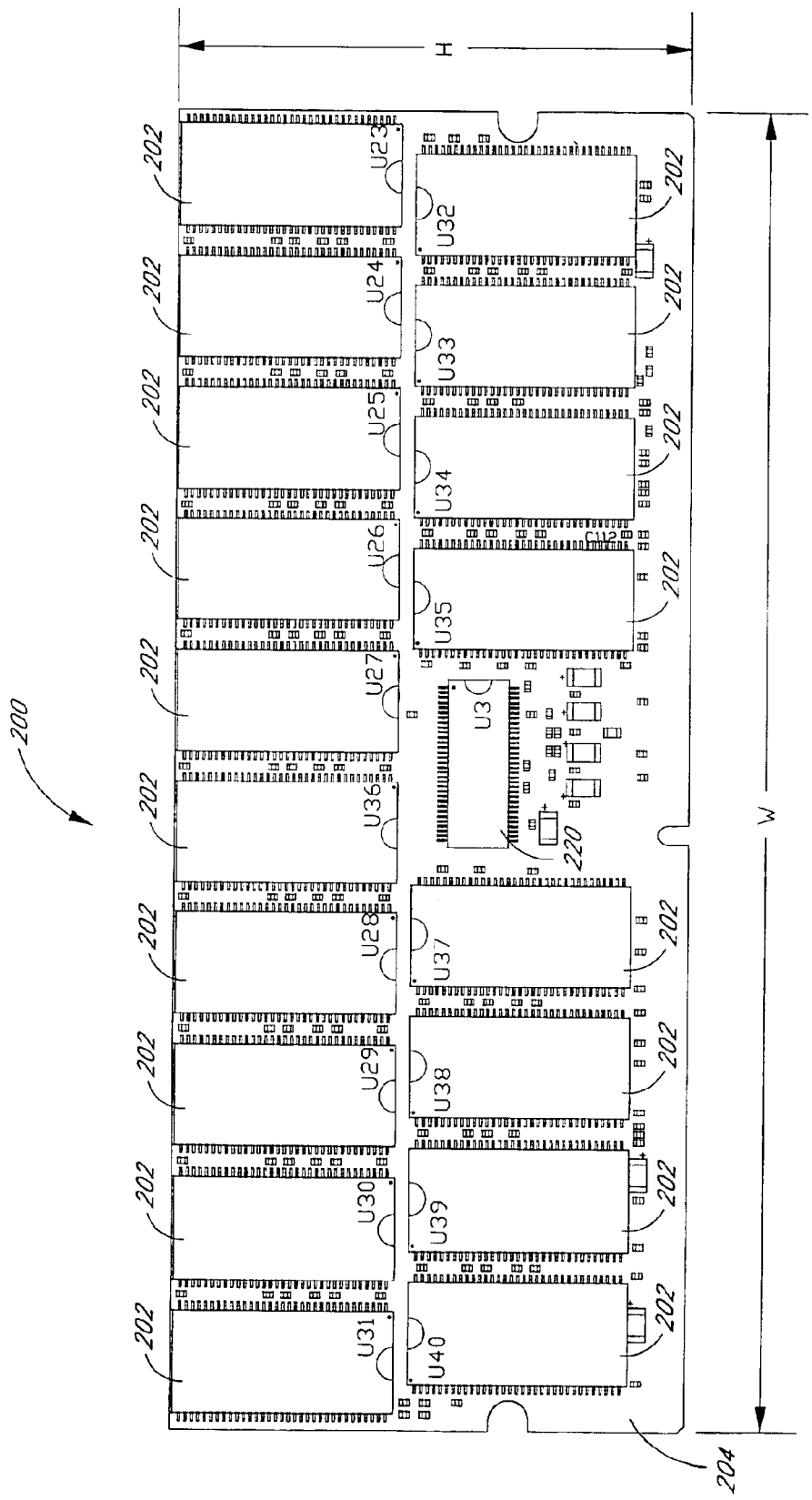
FIG. 2B illustrates a view of the secondary side of the memory module of FIG. 2A.

An embodiment of a memory module 200 that is compatible with the timing requirements for Double Data Rate (DDR) SDRAM is shown in FIG. 2A and FIG. 2B. The DDR SDRAM module 200 comprises memory integrated circuits 202 utilizing standard TSOP packaging that are compatible with the JEDEC DDR timing requirements. The DDR SDRAM module 200 advantageously utilizes bilateral symmetry to achieve the timing requirements specified in the DDR SDRAM requirements on a board 204 having a height (H) of approximately 2 inches and a width (W) of 5.25 inches.

In FIGS. 2A and 2B, the integrated circuits 202 are oriented, as advantageously indicated by an orientation indicia 106, in opposite orientations in a first and a second row, respectively. The trace lengths of signal traces to the integrated circuits 202 in the first (upper) row are maintained to be substantially the same as the signal traces to integrated circuits 202 in the second (lower) row. The integrated circuits 202 mounted to a first half of the memory module 200 are routed to a first register 210 and the integrated circuits 202 mounted to a second half of the memory module 200 are routed to a second register 220. As with the PC133 SDRAM module 100, each data register stores non-contiguous portions of the data word.

Although the invention has been described in terms of certain preferred embodiments, other embodiments that are apparent to those of ordinary skill in the art, including embodiments which do not provide all of the features and advantages set forth herein, are also within the scope of this invention. Accordingly, the scope of the invention is defined by the claims that follow.

What is claimed is:

1. A memory module comprising:
   a printed circuit board having an edge, a first side, and a common signal trace connector area positioned along the edge, the printed circuit board having a line of bilateral symmetry substantially perpendicular to the edge and which bisects the printed circuit board into a first lateral half and a second lateral half, the printed circuit board having a plurality of interconnection levels;
   a first row of integrated circuits identical to one another, the first row mounted on the first side of the printed circuit board, the first row being substantially parallel to the edge and in proximity to the common signal trace connector area, the integrated circuits of the first row having a first orientation direction;
   a second row of integrated circuits identical to the integrated circuits of the first row, the second row mounted on the first side of the printed circuit board, the second row being substantially parallel to the edge and in proximity to the first row and located physically farther from the common signal trace connector than is the first row, the integrated circuits of the second row having a second orientation direction different from the first orientation direction;
   a first register connected to the integrated circuits of the first row and the second row on a first lateral portion of the printed circuit board by a first set of address signal paths;
   a second register connected to the integrated circuits of the first row and the second row on a second lateral portion of the printed circuit board by a second set of address signal paths;
   a first plurality of data lines electrically connecting data pins of the first row of integrated circuits to the common signal trace connector area, each data line of the first plurality of data lines comprising trace portions on different interconnection levels of the printed circuit board, each trace portion having a trace portion length; and
   a second plurality of data lines electrically connecting data pins of the second row of integrated circuits to the common signal trace connector area, each data line of the second plurality of data lines comprising trace portions on different interconnection levels of the printed circuit board, each trace portion having a trace portion length, each data line having a length substantially equal to a sum of the trace portion lengths of the data line, whereby lengths of corresponding data lines of the first plurality of data lines and the second plurality of data lines are substantially the same.

2. The memory module of claim 1, wherein the second orientation direction is rotated in a plane parallel to the printed circuit board by approximately 180 degrees from the first orientation direction.

3. The memory module of claim 1, wherein the first row is bilaterally symmetric with respect to the line of bilateral symmetry.

4. The memory module of claim 1, wherein the second row is bilaterally symmetric with respect to the line of bilateral symmetry.

5. The memory module of claim 1, wherein the first set of address signal paths and the second set of address signal paths are bilaterally symmetric to one another across the line of bilateral symmetry.

6. A method for arranging integrated circuit locations on a printed circuit board for a memory module, the method comprising:
   providing a printed circuit board having an edge, a first side, and a common signal trace connector area positioned along the edge, the printed circuit board having a line of bilateral symmetry substantially perpendicular to the edge and which bisects the printed circuit board into a first lateral half and a second lateral half, the printed circuit board having a plurality of interconnection levels;

mounting a first row of integrated circuits identical to one another on the first side of the printed circuit board, the first row being substantially parallel to the edge and in proximity to the common signal trace connector area, the integrated circuits of the first row having a first orientation direction;

mounting a second row of integrated circuits on the first side of the printed circuit board, the integrated circuits of the second row identical to the integrated circuits of the first row, the second row being substantially parallel to the edge and in proximity to the first row and located physically farther from the common signal trace connector than is the first row, the integrated circuits of the second row having a second orientation direction different from the first orientation direction;

electrically connecting a first register to the integrated circuits of the first row and the second row on a first lateral portion of the printed circuit board by a first set of address signal paths;

electrically connecting a second register to the integrated circuits of the first row and the second row on a second lateral portion of the printed circuit board by a second set of address signal paths;

electrically connecting data pins of the first row of integrated circuits to the common signal trace connector area by a first plurality of data lines, each data line of the first plurality of data lines comprising trace portions on different interconnection levels of the printed circuit board, each trace portion having a trace portion length; and electrically connecting data pins of the second row of integrated circuits to the common signal trace connector area by a second plurality of data lines, each data line of the second plurality of data lines comprising trace portions on different interconnection levels of the printed circuit board, each trace portion having a trace portion length, each data line having a length substantially equal to a sum of the trace portion lengths of the data line, wherein lengths of corresponding data lines of the first plurality of data lines and the second plurality of data lines are substantially the same.

7. The method of claim 6, wherein the second orientation direction is rotated in a plane parallel to the printed circuit board by approximately 180 degrees from the first orientation direction.

8. The method of claim 6, wherein the first row is bilaterally symmetric with respect to the line of bilateral symmetry.

9. The method of claim 6, wherein the second row is bilaterally symmetric with respect to the line of bilateral symmetry.

10. The method of claims 6, wherein the first set of address signal paths and the second set of address signal paths are bilaterally symmetric to one another across the line of bilateral symmetry.

11. The method of claim 6, wherein the first lateral portion comprises the first lateral half.

12. The method of claim 6, wherein the second lateral portion comprises the second lateral half.

13. A memory module comprising:

a printed circuit board having an edge, a first side, and a common signal trace connector area positioned along the edge, the printed circuit board having a line of bilateral symmetry substantially perpendicular to the edge and which bisects the printed circuit board into a first lateral half and a second lateral half, the printed circuit board having a plurality of interconnection levels;

a first row of integrated circuits identical to one another, the first row mounted on the first side of the printed circuit board, the first row being substantially parallel to the edge and in proximity to the common signal trace connector area, the integrated circuits of the first row having a first orientation direction;

a second row of integrated circuits identical to the integrated circuits of the first row, the second row mounted on the first side of the printed circuit board, the second row being substantially parallel to the edge and in proximity to the first row and located physically farther from the common signal trace connector than is the first row, the integrated circuits of the second row having a second orientation different from the first orientation direction;

a first register and a second register;

means for connecting the first register to the integrated circuits of the first row and the second row on a first lateral portion o the printed circuit board;

means for connecting the second register to the integrated circuits of the first row and the second row on a second lateral portion of the printed circuit board; and means for electrically connecting data pins of the first row of integrated circuits to the common signal trace connector area via different interconnection levels of the printed circuit board and for electrically connecting data pins of the second row of integrated circuits to the common signal trace connector area via different interconnection levels of the printed circuit board, whereby corresponding trace lengths to the first row of integrated circuits and the second row of integrated circuits are substantially the same.

14. The memory module of claim 13, wherein the second orientation direction is rotated in a plane parallel to the printed circuit board by approximately 180 degrees from the first orientation direction.

15. The memory module of claim 13, wherein the means for connecting the first register to the integrated circuits of the first row and the second row on the first lateral portion is bilaterally symmetric across the line of bilateral symmetry to the means for connecting the second register to the integrated circuits of the first row and the second row on the second lateral portion.

* * * * *

UNITED STATES PATENT AND TRADEMARK OFFICE
CERTIFICATE OF CORRECTION

PATENT NO. : 6,930,900 B2  Page 1 of 1
DATED : August 16, 2005
INVENTOR(S) : Jayesh R. Bhakta et al.

It is certified that error appears in the above-identified patent and that said Letters Patent is hereby corrected as shown below:

<u>Column 10,</u>
Line 34, after "portion," delete "o" and insert -- of --.

Signed and Sealed this

Twenty-first Day of March, 2006

JON W. DUDAS
*Director of the United States Patent and Trademark Office*